(12) United States Patent
Bosshart

(10) Patent No.: US 6,791,365 B2
(45) Date of Patent: Sep. 14, 2004

(54) DYNAMIC LOGIC CIRCUITS USING TRANSISTORS HAVING DIFFERING THRESHOLD VOLTAGES AND DELAYED LOW THRESHOLD VOLTAGE LEAKAGE PROTECTION

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 146 days.

(21) Appl. No.: 10/307,183

(22) Filed: Nov. 29, 2002

(65) Prior Publication Data

US 2004/0104744 A1 Jun. 3, 2004

(51) Int. Cl.[7] .......................................... H03K 19/094
(52) U.S. Cl. ...................................... 326/98; 326/121
(58) Field of Search ............................ 326/93–98, 112, 326/119, 121

(56) References Cited

U.S. PATENT DOCUMENTS 6,466,057 B1 * 10/2002 Naffziger ................... 326/121
6,529,045 B2 * 3/2003 Ye et al. ...................... 326/95
6,590,424 B2 * 7/2003 Singh et al. .................. 326/93

* cited by examiner

Primary Examiner—Don Le
(74) Attorney, Agent, or Firm—Alan K. Stewart; W. James Brady, III; Frederick J. Telecky, Jr.

(57) ABSTRACT

A dynamic logic circuit (30). The dynamic logic circuit comprises a precharge node ($30_{PN}$) to be precharged to a precharge voltage ($V_{DD}$) during a precharge phase and a conditional discharge path ($30_L$, $30_{DT}$) connected to the precharge node. The conditional discharge path is operable, during an evaluate phase, to conditionally couple the precharge node to a voltage different than the precharge voltage. The dynamic logic circuit also comprises an output ($OUT_3$) for providing a signal in response to a state at the precharge node. Lastly, the dynamic logic circuit comprises voltage maintaining circuitry ($30_{KT1}$, $30_{KT2}$), coupled to the output, for coupling the precharge voltage to the precharge node during a portion of an instance of the evaluate phase when the conditional discharge path is not enabled during the instance of the evaluate phase.

39 Claims, 2 Drawing Sheets

DYNAMIC LOGIC CIRCUITS USING TRANSISTORS HAVING DIFFERING THRESHOLD VOLTAGES AND DELAYED LOW THRESHOLD VOLTAGE LEAKAGE PROTECTION

CROSS-REFERENCES TO RELATED APPLICATIONS

This application is related to U.S. patent application Ser. No. 10/307,035 entitled "Hold Time Latch With Decreased Precharge Node Voltage Leakage", and filed on the same date as the present application.

STATEMENT REGARDING FEDERALLY SPONSORED RESEARCH OR DEVELOPMENT

Not Applicable.

BACKGROUND OF THE INVENTION

The present embodiments relate to electronic circuit devices and are more particularly directed to dynamic logic circuits using transistors having differing threshold voltages and delayed low threshold voltage leakage protection.

Electronic circuits have become prevalent in numerous applications, including uses for devices in personal, business, and other environments. Demands of the marketplace affect many aspects of circuit design, including factors such as device power consumption and speed. Various electronic circuits now implement what is known in the art as dynamic, or domino, logic. Dynamic logic circuitry operates in two phases, a precharge phase during which one or more precharge nodes are precharged to a first voltage, and an evaluate phase during which the data is read based on the voltage at each precharge node, where the precharge voltage therefore may be read as a first logic state if undisturbed or where that precharge voltage may be first discharged and then read as a second logic that is complimentary to the first logic state. Further, dynamic logic often passes signals through two or more stages, so that an evaluation by a first stage that discharges the first stage precharge node results in an output to the input of a second stage, and where that signal also thereby triggers a discharge of a precharge node in the second stage. In this manner, a number of stages may be triggered as the evaluate phases of the stages overlap and the output of each stage propagates through to the next successive stage.

The art has recognized that current may leak from the dynamic logic precharge node during its evaluate phase in the instance when the discharge path to that precharge node is not enabled during that evaluate phase. Indeed, it is known in the art that the discharge path of the dynamic logic stage may include one or more so-called low threshold voltage ("LVT") transistors, where such transistors are sometimes used in a discharge path in order to increase the speed of that path when the path is enabled. In such a case, each LVT transistor has a relatively lower threshold transistor as compared to other transistors in the same circuit, and such other transistors are therefore referred to as high threshold voltage ("HVT") transistors. In one previous approach, at least one HVT transistor is also included in the discharge path. Indeed, for numerous additional details relating to such an approach and related aspects, the reader is invited to review U.S. Pat. No. 5,831,451, entitled "Dynamic Logic Circuits Using Transistors Having Differing Threshold Voltages," issued Nov. 3, 1998, having the same inventor and assignee of the subject application, and U.S. Pat. No. 5,821,778, entitled "Using cascode transistors having low threshold voltages," issued Oct. 13, 1998, having the same inventor and assignee of the subject application, where both of these two patents are hereby incorporated herein by reference. In any event, the use of an LVT transistor (or more than one such transistor) correspondingly provides increased leakage when it is not enabled and, as such, when implemented in the discharge path of a dynamic logic stage, that transistor increases leakage when that discharge path is not enabled. Increased leakage is undesirable because it increases device power consumption and, indeed, if severe, may jeopardize the proper operation of the circuit.

By way of further background, in dual rail dynamic logic circuits an approach has been implemented in an effort to alleviate the above-described leakage that occurs from the precharge node during the evaluate phase. Specifically, dual rail dynamic logic circuits include two precharge nodes, where during the evaluate phase one or the other of the precharge nodes is, by definition of the dual-rail system, assured to discharge, while at the same time therefore the other of the two precharge nodes remains charged. Thus, the charged precharge node can leak, particularly if there are one or more LVT transistors in a discharge path connected to the charged precharge node. Also in such a circuit, however, often a cross-coupled pair of LVT p-channel transistors is connected such that the source/drain path of each such transistor is connected to a respective precharge node while the gate of each respective transistor is connected to the opposite respective precharge node. As a result, when one precharge node is discharged low, that same node provides an enabling voltage to the opposing cross-coupled p-channel transistor, and that transistor, when enabled, conducts a source voltage to the opposing precharge node, thereby maintaining it at a sufficient level despite any leakage through its respective discharge path. Moreover, note in this case that the cross-coupled transistors are LVT transistors; as such, the LVT transistor provides a less-resistive connection between $V_{DD}$ and the precharge node as compared to an HVT transistor. This is desirable, particularly at low operating voltages, when the relative drive currents of HVT transistors may diminish considerably as compared to their LVT counterparts. Also, the use of an LVT p-channel transistor in this manner is desirable because using an HVT transistor to provide such a coupling may prove insufficient to hold the precharge node at a sufficient voltage against the leakage of one or more LVT transistors in the discharge path. Still further, without sufficiently holding the precharge voltage high under these circumstances, insufficient noise margin may result and dynamic nodes may switch when they are not supposed to, due to noise or leakage currents, or both.

By way of still further background, in single rail dynamic logic circuits, it is known in the art to include an HVT p-channel transistor as a feedback, or sometimes referred to as a "keeper" transistor, connected such that the transistor gate is connected to the circuit output, the transistor source is connected to a voltage source, and the transistor drain is connected to the precharge node. In this manner, when the dynamic logic circuit is in its evaluate phase but its discharge path is not enabled, then the high precharge voltage is inverted and applied to the gate of the feedback transistor. In response, that transistor conducts and thereby couples the source voltage to the precharge node. In theory, therefore, this coupling of voltage offsets any leakage that may occur through the discharge path of the circuit. Moreover, the single feedback p-channel transistor cannot simply be made to be an LVT transistor because then, in instances when the discharge path is fully enabled and includes an HVT transistor, that HVT transistor included in the discharge path may provide a limit that keeps the discharge path from satisfactorily pulling down the precharge node, since that precharge node would be connected to a source voltage through a less-resistive LVT p-channel transistor. In other words, the HVT discharge path transistor may not provide sufficient drive current to overcome the LVT feedback p-channel transistor.

While the preceding approaches implemented with respect to dynamic logic circuits have proven satisfactory in many applications, the leakage in the discharge path of the circuit may be unacceptable, particularly when the leakage in that path is increased due to the use of one or more LVT n-channel transistors. Further, while an HVT p-channel keeper transistor may provide some current to compensate for the leakage of an LVT n-channel transistor in a single rail dynamic logic circuit, it has been recognized in connection with the preferred embodiments that such an approach alone may not be satisfactory for various reasons. Specifically, in order for the HVT p-channel keeper transistor to serve its purpose in this regard, the current it provides when enabled (i.e., the "on-current" of the p-channel transistor) must be sufficiently larger than the leakage current of the LVT n-channel transistor (i.e., the "off-current" of the n-channel transistor). However, this goal is becoming increasingly more difficult because there are various factors that are tending to decrease the ratio of the on-current of the HVT p-channel transistor relative to the off-current of the LVT n-channel transistor. For example, as the system source voltage, $V_{DD}$, decreases in circuit design as is the current trend, the above-described current ratio decreases. As another factor, transistor threshold voltage is a function of temperature, that is, high temperatures decrease threshold voltage, and this too decreases the subject current ratio. As still another factor, there is a trend to build many low threshold voltage transistors in a manner to provide more drive current, once more decreasing the above-discussed ratio. Finally, n-channel transistors are stronger in current provision than p-channel transistors, still again decreasing the above-discussed ratio. With these factors, note therefore that the HVT p-channel transistor attempts to source sufficient current to compensate for the leakage of the LVT n-channel transistor, but in that attempt an increasingly larger amount of voltage is dropped across the HVT p-channel transistor, particularly in a relative sense as its strength is reduced relative to that of the n-channel transistor. The increase in voltage drop may be detrimental for various reasons, including calling into question the reliability of data validity of the dynamic logic circuit. However, because the feedback transistor is an HVT transistor, it is likely unable to provide sufficient current to offset the larger amount of current that may be lost through leakage of any LVT transistor in the circuit discharge path.

Given the preceding, the preferred embodiments seek to improve upon the limitations and drawbacks of the prior art, as discussed in detail below.

BRIEF SUMMARY OF THE INVENTION

In the preferred embodiment, there is a dynamic logic circuit. The dynamic logic circuit comprises a precharge node to be precharged to a precharge voltage during a precharge phase and a conditional discharge path connected to the precharge node. The conditional discharge path is operable, during an evaluate phase, to conditionally couple the precharge node to a voltage different than the precharge voltage. The dynamic logic circuit also comprises an output for providing a signal in response to a state at the precharge node. Lastly, the dynamic logic circuit comprises voltage maintaining circuitry, coupled to the output, for coupling the precharge voltage to the precharge node during a portion of an instance of the evaluate phase when the conditional discharge path is not enabled during the instance of the evaluate phase.

Other aspects are also disclosed and claimed.

DETAILED DESCRIPTION OF THE INVENTION

Figure 1:
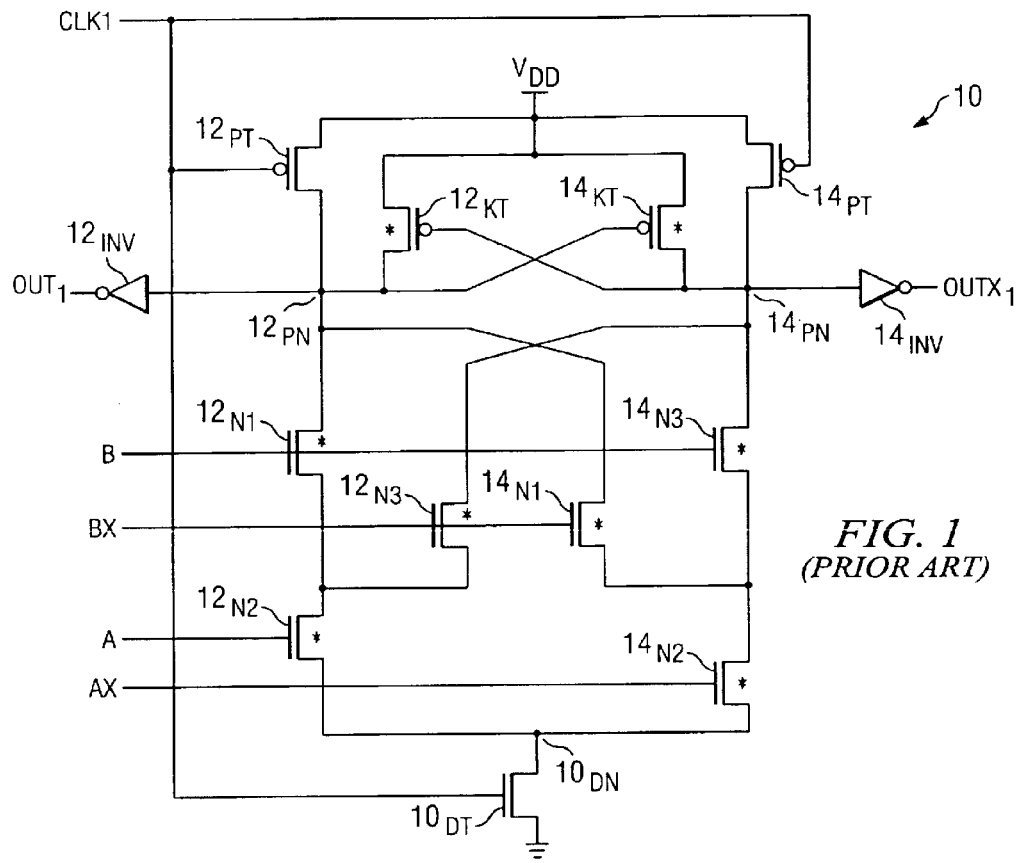
FIG. 1 illustrates a schematic of a prior art dual rail dynamic logic circuit with cross-coupled LVT p-channel transistors connected to the precharge nodes of the circuit.

By way of background to the preferred embodiments, FIG. 1 is now discussed to provide additional context and detail with respect to the prior art introduced earlier in the Background Of The Invention section of this document. Specifically, FIG. 1 illustrates a schematic of a prior art dual rail dynamic logic circuit system designated generally at 10, where dynamic logic is also sometimes referred to as a "domino" logic. In general, system 10 may be considered about a vertical imaginary line down the middle of the Figure, where symmetric items about both sides of that line contribute to provide dual rail output signals, that is, complementary signals, during the data output period for system 10, where as described below that period is the evaluate phase of system 10.

Looking toward the left of FIG. 1, system 10 includes a precharge transistor $12_{PT}$, a precharge node $12_{PN}$, an output inverter $12_{INV}$, and a low threshold voltage ("LVT") p-channel transistor keeper transistor $12_{KT}$, where the LVT transistor is designated with an asterisk to indicate its LVT attribute and this convention is used throughout the remainder of this document for other transistors as well. Precharge node $12_{PN}$ is connected to the input of output inverter $12_{INV}$, and the output of inverter $12_{INV}$ provides an output signal $OUT_1$. Precharge node $12_{PN}$ is also connected to the drain of precharge transistor $12_{PT}$ which is an HVT p-channel transistor, where the source of precharge transistor $12_{PT}$ is connected to a system voltage source, $V_{DD}$, and the gate of precharge transistor $12_{PT}$ is connected to a clock signal, CLK1. Further, precharge node $12_{PN}$ is connected to the drain of keeper transistor $12_{KT}$, which is an LVT p-channel transistor, where the source of keeper transistor $12_{KT}$ is connected to $V_{DD}$ and the gate of keeper transistor $12_{KT}$ is cross-coupled to precharge node $14_{PN}$. Precharge node $12_{PN}$ also is coupled to a discharge node $10_{DN}$ through the source/drain paths of different transistor combinations. First, precharge node $12_{PN}$ is coupled to discharge node $10_{DN}$ through the source/drain path of an LVT n-channel transistor $12_{N1}$ having its gate connected to a signal B and the source/drain path of an LVT n-channel transistor $12_{N2}$ having its gate connected to a signal A. Second, precharge node $12_{PN}$ is coupled to discharge node $10_{DN}$ through the source/drain path of an LVT n-channel transistor $14_{N1}$ having its gate connected to a signal BX and the source/drain path of an LVT n-channel transistor $14_{N2}$ having its gate connected to a signal AX. Note with respect to signals BX and AX that the "X" designation is to indicate a complementary signal, that is, AX is the complement of A and BX is the complement of B, where this convention of using an "X" in this manner is used with other signals also in this document. Lastly, discharge node $10_{DN}$ is connected via the source/drain path of an HVT n-channel discharge transistor $10_{DT}$ to ground, where discharge transistor $10_{DT}$ has its gate connected to CLK1. Given the preceding, two alternative paths are created from precharge node $12_{PN}$ to ground, and each such path may be referred to as a conditional discharge path because, as shown below, it permits a discharge along the entire path if the input to each device along that path is enabling such that the respective device is enabled.

Looking toward the right of FIG. 1, system 10 includes a precharge transistor $14_{PT}$, a precharge node $14_{PN}$, an output inverter $14_{INV}$, and an LVT p-channel keeper transistor $14_{KT}$. Precharge node $14_{PN}$ is connected to the input of output inverter $14_{INV}$, and the output of inverter $14_{INV}$ provides an output signal $OUTX_1$, that is, the dual rail of output $OUT_1$. Precharge node $14_{PN}$ is also connected to the drain of precharge transistor $14_{PT}$, which is an HVT p-channel transistor, where the source of precharge transistor $14_{PT}$ is connected to $V_{DD}$ and the gate of precharge transistor $14_{PT}$ is connected to CLK1. Further, precharge node $14_{PN}$ is connected to the drain of keeper transistor $14_{KT}$, which is an LVT p-channel transistor, where the source of keeper transistor $14_{KT}$ is connected to $V_{DD}$ and the gate of keeper transistor $14_{KT}$ is cross-coupled to precharge node $12_{PN}$. Precharge node $14_{PN}$ also is coupled to discharge node $10_{DN}$ through the source/drain paths of various transistor combinations. First, precharge node $14_{PN}$ is coupled to discharge node $10_{DN}$ through the source/drain path of an LVT n-channel transistor $14_{N3}$ having its gate connected to signal B and the source/drain path of LVT n-channel transistor $14_{N2}$ having its gate connected to signal AX. Second, precharge node $14_{PN}$ is connected to discharge node $10_{DN}$ through the source/drain path of an LVT n-channel transistor $12_{N3}$ having its gate connected to BX and the source/drain path of LVT n-channel transistor $12_{N2}$. Thus, two alternative paths are created from precharge node $14_{PN}$ to ground, and each such path also may be referred to as a conditional discharge path for reasons discussed above.

The operation of system 10 is now explored, first by introducing three general aspects. First, as indicated above, each transistor that is an LVT transistor in system 10 is shown in FIG. 1 by including an asterisk next to the transistor schematic. With respect to each such LVT transistor, it has a relatively low threshold voltage relative to the other like-conductivity types of transistors in the circuit, that is, LVT n-channel transistors have lower threshold voltages than HVT n-channel transistors in system 10, and LVT p-channel transistors have lower threshold voltages than HVT p-channel transistors in system 10. A greater discussion of such "LVT" transistors is provided in the U.S. Pat. Nos. 5,831,451 and 5,821,778, incorporated earlier in the Background Of The Invention section of this document. Second, in general, system 10 operates in two phases of operation, where those phases are caused by the state of CLK1. A precharge phase of operation occurs when CLK1 is low, and during this phase precharge nodes $12_{PN}$ and $14_{PN}$ are precharged high and, thus, outputs $OUT_1$ and $OUTX_1$ are both low. The precharge phase is followed by an evaluate phase wherein CLK1 is high; in this latter phase, outputs $OUT_1$ and $OUTX_1$ are valid, and as a dual-rail system, one of those two outputs is high while the other is low. Third, during the evaluate phase of operation, the choice of which output is high and which is low is provided by the states of the inputs A, B, AX, and BX, where those inputs therefore provide a logic equation that dictates the output values for system 10. Each of these aspects is further explored below.

When CLK1 is low, it enables both p-channel precharge transistors $12_{PT}$ and $14_{PT}$, and at the same time it disables n-channel discharge transistor $10_{DT}$, thereby placing system 10 in its precharge phase of operation. Thus, each of p-channel precharge transistors $12_{PT}$ and $14_{PT}$ couples $V_{DD}$ to one of precharge nodes $12_{PN}$ and $14_{PN}$, respectively, to which its drain is connected. Thus, during the precharge phase, precharge nodes $12_{PN}$ and $14_{PN}$ remain precharged without any conduction through any of the conditional discharge paths. Also during this phase, the high voltage on each precharge node $12_{PN}$ and $14_{PN}$ is inverted by the respective inverter $12_{INV}$ and $14_{INV}$, respectively, to provide low signals at outputs $OUT_1$ and $OUTX_1$, respectively. Further, the high signals at precharge nodes $12_{PN}$ and $14_{PN}$ disable both p-channel keeper transistors $12_{KT}$ and $14_{KT}$.

Following the precharge phase of operation of system 10, CLK1 transitions high, in which case it disables both p-channel precharge transistors $12_{PT}$ and $14_{PT}$, and at the same time it enables n-channel discharge transistor $10_{DT}$, thereby placing system 10 in its evaluate phase of operation. During the evaluate phase, inputs are A, AX, B, and BX are valid, where they may be provided from some other circuit, being either a static or dynamic circuit. By way of example, therefore, assume that both A and B are high during the evaluate phase. As such, both n-channel transistors $12_{N1}$ and $12_{N2}$ are enabled, as is n-channel discharge transistor $10_{DT}$ due to the high CLK1; thus, a discharge path is enabled from precharge node $12_{PN}$ to ground via these three transistors. As a result, the voltage from precharge node $12_{PN}$ drops to ground, and this falling transition causes a rising transition at output $OUT_1$ from inverter $12_{INV}$. At the same time, by definition as complements, AX and BX are low, and thus no conditional path is enabled from precharge node $14_{PN}$ to ground. As a result, the voltage from precharge node $14_{PN}$ remains high, and this high voltage causes a low output $OUTX_1$ from inverter $14_{INV}$. Indeed, given the other signal possibilities and connectivity of system 10, then one skilled in the art will appreciate that outputs $OUT_1$ and $OUTX_1$ realize the logical equations shown in the following Equations 1 and 2:

$OUT_1$=(B AND A) OR (BX AND AX)       Equation 1

$OUTX_1$=(B and AX) OR (BX AND A)      Equation 2

In addition to the preceding, a noteworthy observation is made with respect to the effect of the cross-coupled LVT p-channel keeper transistor $12_{KT}$ and $14_{KT}$ during the evaluate phase. From the preceding discussion, one skilled in the art will appreciate that during any evaluate phase, one of the two precharge nodes $12_{PN}$ and $14_{PN}$ discharges while the other remains charged. For the precharge node that remains charged, however, such a precharge node is connected to two different conditional discharge paths, and each of those paths includes two LVT n-channel transistors. For example, precharge node $12_{PN}$, when charged, is still connected via transistors $12_{N1}$ and $12_{N2}$ to discharge node $10_{DN}$, or alternatively it is connected via transistors $14_{N1}$ and $14_{N2}$ to discharge node $10_{DN}$. While these conditional discharge paths are not enabled at this time, the LVT nature of those transistors causes them to leak current, and as a result there is a draw on the voltage at precharge node $12_{PN}$. However, also at this time, recall that the opposite precharge node $14_{PN}$ is low, and recall further that this low voltage is cross-connected to the gate of p-channel keeper transistor $12_{KT}$. As a result, keeper transistor $12_{KT}$ is enabled, thereby coupling $V_{DD}$ to precharge node $14_{PN}$. As a result, by virtue of keeper transistor $12_{KT}$ being an LVT transistor, it provides an LVT current source to precharge node $12_{PN}$, thereby offsetting the LVT current leakage that will occur from precharge node $12_{PN}$ to ground along the disabled conditional discharge paths. Having shown how p-channel keeper transistor $12_{KT}$ operates in this respect when precharge node $12_{PN}$ is high and precharge node $14_{PN}$ is therefore low, one skilled in the art will appreciate the complementary operation of p-channel keeper transistor $14_{KT}$ when precharge node $14_{PN}$ is high (and precharge node $12_{PN}$ is therefore low). Thus, such an approach provides improved operation for a dual rail circuit; however, as shown below, a single p-channel keeper transistor per precharge node is not workable in a single rail dynamic logic circuit, where later the preferred embodiments are instead shown to provide a solution in this regard.

Figure 2:
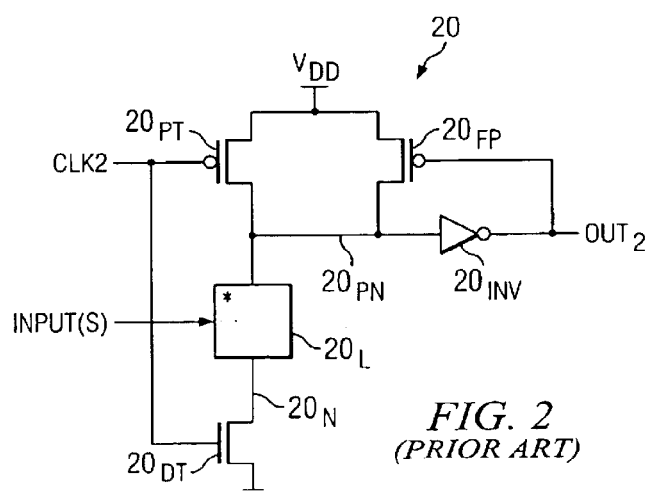
FIG. 2 illustrates a schematic of a prior art single rail dynamic logic circuit with an HVT p-channel feedback transistor connected to provide voltage to the precharge node when the precharge node is not discharged by the circuit discharge path.

By way of additional background to the preferred embodiments, FIG. 2 is now discussed also to elaborate with respect to the prior art introduced earlier in the Background Of The Invention section of this document. Specifically, FIG. 2 illustrates a schematic of a prior art single rail dynamic logic circuit system designated generally at 20. System 20 includes a precharge transistor $20_{PT}$, a precharge node $20_{PN}$, an output inverter $20_{INV}$, an HVT p-channel feedback transistor $20_{FP}$, and a conditional discharge path including both a logic circuit $20_L$ and a discharge transistor $20_{DT}$. Looking in more detail to these devices, precharge transistor $20_{PT}$ typically is an HVT p-channel transistor and is typically smaller than the n-channel transistors shown in FIG. 2. Precharge transistor $20_{PT}$ has a source connected to a source of the system voltage level (e.g., $V_{DD}$) and a drain connected to precharge node $20_{PN}$. A clock signal, CLK2, is connected to the gate of precharge transistor $20_{PT}$, and it is also connected to the gate of discharge transistor $20_{DT}$. Discharge transistor $20_{DT}$ is an HVT n-channel transistor having its source connected to a low reference voltage (e.g., ground) and its drain connected to a node $20_N$. Between precharge node $20_{PN}$ and node $20_N$ is connected a logic circuit $20_L$. The particular logic of logic circuit $20_L$ may implement any type of logic equation. For example, often logic circuit $20_L$ includes numerous n-channel transistors connected in various fashions to implement a logic equation, and the logic function of that equation is determined based on the particular transistor configuration as well as the respective input signals connected to the gates of those transistors. For purposes of the present discussion, the particular logic equation and inputs are not important and, thus, the word INPUT(S) is generally shown with it understood that such signals may come from any of various other circuits, being static, dynamic, or both. Moreover, preferably the n-channel transistor transistor(s) within logic circuit $20_L$ are LVT n-channel transistors and, thus, have a low threshold voltage relative to the n-channel discharge transistor $20_{DT}$, where again a greater discussion of such "LVT" transistors is provided in the U.S. Pat. Nos. 5,831,451 and 5,821,778, incorporated earlier in the Background Of The Invention section of this document. Once more to designate the use of LVT transistors in logic circuit $20_L$, it is labeled with an asterisk.

The operation of system 20, as a dynamic logic circuit, also includes both a precharge and an evaluate phase. Specifically, when CLK2 is low, it enables p-channel precharge transistor $20_{PT}$, and at the same time it disables n-channel discharge transistor $20_{DT}$, thereby placing system 20 in its precharge phase of operation. Thus, p-channel precharge transistor $20_{PT}$ couples $V_{DD}$ to precharge node $20_{PN}$. Thus, precharge node $20_{PN}$ remains precharged during the precharge phase without any conduction through the conditional discharge path. Also during this precharge phase, the high voltage on precharge node $20_{PN}$ is inverted by inverter $20_{INV}$ to provide a low signal at output $OUT_2$. Further, the low signal at output $OUT_2$ is connected to the gate of, and thereby enables, p-channel feedback transistor $20_{FP}$, and this HVT transistor also couples $V_{DD}$ to precharge node $20_{PN}$. Alternatively, when CLK2 transitions high, it disables p-channel precharge transistor $20_{PT}$, and at the same time it enables n-channel discharge transistor $20_{DT}$, thereby placing system 20 in its evaluate phase of operation. During the evaluate phase, the INPUT(S) are valid, where they may be provided from some other circuit, being either a static or dynamic circuit. Thus, based on the states of the INPUT(S), if a logic equation of logic circuit $20_L$ is satisfied, then a conductive path is created through that circuit, whereas if no such logic equation is satisfied, then no conductive path is created through that circuit. In the first instance, that is, where the conditional discharge path is enabled, then precharge node $20_{PN}$ is discharged through logic circuit $20_L$ and the already-enabled discharge transistor $20_{DT}$, thereby causing the voltage at precharge node $20_{PN}$ to drop to ground and the output $OUT_2$ to rise. In the second instance, that is, where the conditional discharge path is not enabled, then the voltage at precharge node $20_{PN}$ is not initially discharged; however, also at this time, the one or more LVT transistors in logic circuit $20_L$ will leak, thereby pulling down the precharge voltage that is desired to remain undisturbed at precharge node $20_{PN}$. At the same time, note further that the precharge voltage is inverted, thereby providing a low voltage at output $OUT_2$, which enables p-channel feedback transistor $20_{FP}$. However, p-channel feedback transistor $20_{FP}$ is an HVT transistor, and therefore there is the result that this HVT transistor attempts to offset the leakage provided by the LVT transistor(s) in logic circuit $20_L$. As described earlier, this mis-match in threshold voltage strength may not prove suitable in various circumstances.

Figure 3:
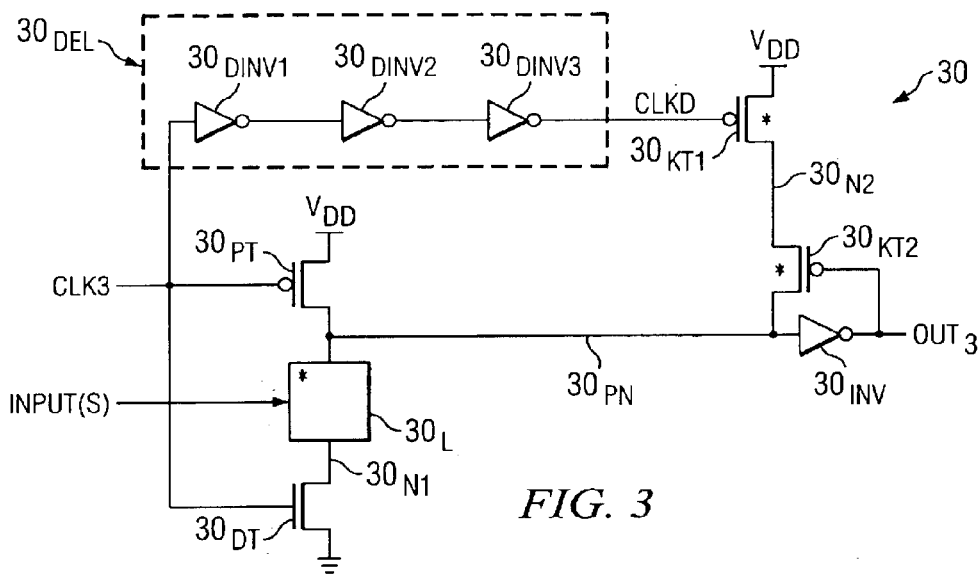
FIG. 3 illustrates a schematic of a preferred embodiment dynamic logic circuit including a delay circuit and an LVT p-channel transistor supply circuit, wherein the delay circuit enables the supply circuit after the dynamic logic circuit has commenced its evaluate phase and in the instance when the precharge node has not been discharged by the circuit discharge path.

FIG. 3 illustrates a schematic of an inventive single rail dynamic logic circuit designated generally at 30. System 30 in some respects resembles system 20 of FIG. 2, where one skilled in the art will readily appreciate certain commonality. However, system 30 includes additional aspects, thereby providing in combination an overall improved system, as will be apparent following the remaining discussion. Looking now in more detail to those items in system 30 that are comparable in some respects to those in system 20, system 30 includes a precharge transistor $30_{PT}$, a precharge node $30_{PN}$, an output inverter $30_{INV}$, and a conditional discharge path including both a logic circuit $30_L$ and a discharge transistor $30_{DT}$. Precharge transistor $30_{PT}$ is preferably an HVT p-channel transistor and is typically smaller than the n-channel transistors shown in FIG. 3. Precharge transistor $30_{PT}$ has a source connected to a source of the system voltage level (e.g., $V_{DD}$) and a drain connected to precharge node $30_{PN}$. A clock signal, CLK3, is connected to the gate of precharge transistor $30_{PT}$, and it is also connected to the gate of discharge transistor $30_{DT}$. Discharge transistor $30_{DT}$ is preferably an n-channel transistor having its source connected to a low reference voltage (e.g., ground) and its drain connected to a node $30_{N1}$. Between precharge node $30_{PN}$ and node $30_{N1}$ is connected a logic circuit $30_L$. The particular logic of logic circuit $30_L$ may implement any type of logic equation, and preferably logic circuit $30_L$ includes one or more LVT n-channel transistors connected in various fashions to implement a logic equation, where the logic function of that equation is determined based on the particular transistor configuration as well as the respective input signals connected to those transistors (e.g., to the gates or one of the source/drain nodes). Again, the particular logic equation and inputs are not important and, thus, the word INPUT(S) is generally shown with it understood that such signals may come from any of various other circuits, being static, dynamic, or both.

Looking now to various differences between the inventive system 30 and prior art system 20, CLK3 is also connected as an input to a delay circuit $30_{DEL}$, which for reasons detailed below provides an output delayed clock signal, CLKD, that preferably represents an inverted form of CLK3 and has transitions that are delayed with respect to CLK3 by a period of time that is shorter than the evaluation period of system 30, yet longer than the time that system 30 takes to transition when its conditional discharge path is enabled. In the illustrated example, this delay is achieved by making it equal to three signal inversions, that is, it is accomplished by connecting CLK3 into a series connection of three inverters $30_{DINV1}$, $30_{DINV2}$, $30_{DINV3}$, so that the output of inverter $30_{DINV3}$ provides the CLKD signal. The CLKD signal is connected to the gate of an LVT p-channel keeper transistor $30_{KT1}$ that has its source connected to $V_{DD}$ and its drain connected to a node $30_{N2}$. Node $30_{N2}$ is also connected to the source of an LVT p-channel keeper transistor $30_{KT2}$ that has its drain connected to precharge node $30_{PN}$ and its gate connected to output $OUT_3$, that is, to the output of inverter $30_{INV}$. Also, consistent with the earlier conventions, both LVT p-channel keeper transistors $30_{KT1}$ and $30_{KT2}$ are labeled with asterisks to indicate the preference that each such transistor is an LVT device. Lastly, note for sake of simplification that FIG. 3 does not illustrate an additional HVT feedback transistor such as p-channel feedback transistor $20_{FP}$ shown in FIG. 2; however, such a device also could be connected in the same manner as shown in FIG. 2, thereby providing an additional coupling of $V_{DD}$ to precharge node $30_{PN}$ when output $OUT_3$ is low and, indeed, even in the instances when p-channel keeper transistors $30_{KT1}$ and $30_{KT2}$ are disabled.

Before detailing the operation of system 30, additional observations are noteworthy with respect to the use of a low threshold voltage transistor versus a high threshold voltage transistor as those devices are also included in the preferred embodiment. In this regard, note that these terms are used to designate the relative values of one transistor's threshold voltage versus another transistor's threshold voltage and are not necessarily limiting those terms to certain absolute values. Particularly, it is known in the art that a transistor's threshold voltage may be determined by measuring its current-voltage characteristics to determine a gate-to-source voltage where the transistor conducts a small amount of current. To demonstrate the relative nature of threshold voltages, consider the following. For a first transistor with a first threshold voltage, it will provide a first amount of drive current at a given drain-to-source voltage (with its gate connected to its drain). For a second transistor with a second threshold voltage lower than that of the first transistor, the second transistor will provide a second amount of drive current at the given drain-to-source voltage (with its gate connected to its drain), and which drive current is larger than the first amount of drive current provided by the first transistor at that same drain-to-source voltage. Thus, within this document and with respect to the preferred embodiments, a transistor of the first type is referred to as an HVT transistor (i.e., a transistor with a relatively high $V_T$) while a transistor of the second type is referred to as an LVT transistor (i.e., a transistor with a relatively low $V_T$). Further, note that an HVT transistor preferably has a $V_T$ on the order of that for transistors which are now used throughout a circuit where all transistors share the same $V_T$, and where that $V_T$ was determined to be high enough to avoid unacceptably large leakage currents. Note also that although an LVT transistor provides the benefit of a higher drive current as opposed to an HVT transistor, in contrast it gives rise to the detriment that it provides a greater leakage current than an HVT transistor. Indeed, the typical leaking by an LVT transistor may be greater than that of an HVT transistor by two or three orders of magnitude or more. Lastly, since LVT and HVT have been shown as relative terms, note in FIG. 3 that each of p-channel transistors $30_{KT1}$ and $30_{KT2}$, as LVT transistors, preferably has a lower $V_T$ as compared to at least one other p-channel transistor in system 30, such as in comparison to p-channel precharge transistor $30_{PT}$ or in comparison to the p-channel transistor which will be understood by one skilled in the art to be included in inverter $30_{INV}$.

The operation of system 30 is now described, and the following demonstrates that the inclusion of delay circuit $30_{DEL}$ and p-channel keeper transistors $30_{KT1}$ and $30_{KT2}$ provides additional protection against voltage being lost at precharge node $30_{PN}$, where such protection is provided in that in certain instances these LVT transistors provide additional drive current to that node to offset the current leakage by any one or more LVT transistors in logic circuit $30_L$, thereby operating to maintain the precharge voltage at precharge node $30_{PN}$. In addition, however, the inclusion of these devices is such that in other instances proper data switching at precharge node $30_{PN}$ is not disturbed. These attributes and benefits are further explored below in connection with the two possible instances of operation of the conditional data path in response to the INPUT(S), wherein in a first instance the INPUT(S) are such that the conditional data path is enabled as described in connection with FIG. 4, and wherein in a second instance the INPUT(S) are such that the conditional data path is not enabled as described in connection with FIG. 5.

Figure 4:
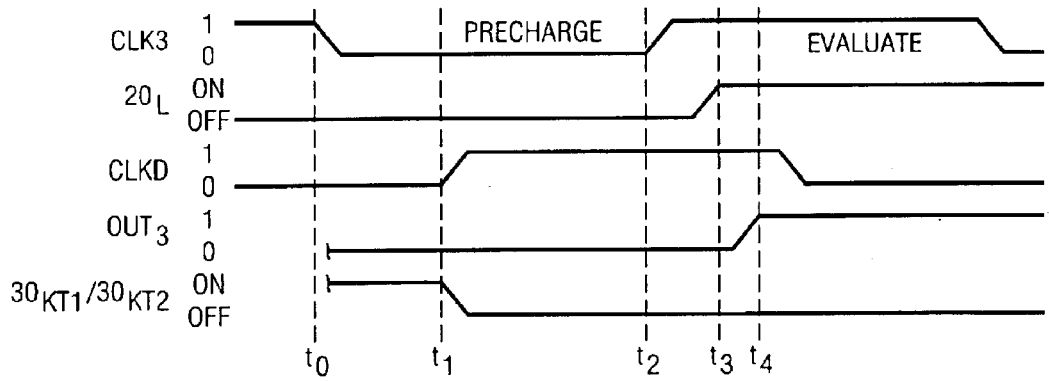
FIG. 4 illustrates a timing diagram of the operation of the preferred embodiment of FIG. 3 where the conditional data path from the precharge node to ground is enabled during the evaluate phase of operation.

FIG. 4 illustrates a timing diagram of various signals in connection with system 30 and for an example where the conditional data path from precharge node $30_{PN}$ to ground is enabled during the evaluate phase of operation, while the figure also illustrates for completeness the preceding precharge phase of operation. Looking, then, to the signals, at a time $t_0$, CLK3 transitions low, thereby enabling p-channel precharge transistor $30_{PT}$ and disabling n-channel discharge transistor $30_{DT}$. With precharge p-channel transistor $30_{PT}$ enabled, precharge node $30_{PN}$ is coupled to $V_{DD}$; thus, following to FIG. 4 labels the CLK3 signal as corresponding to the precharge phase of operation. Also during the precharge phase, the $V_{DD}$ coupled to precharge node $30_{PN}$ is inverted by inverter $30_{INV}$ so that output $OUT_3$ is low, and this low is connected to the gate of p-channel keeper transistor $30_{KT2}$ and thereby enables that transistor. Also at the beginning of the precharge phase, CLKD is low, and this low is connected to the gate of p-channel keeper transistor $30_{KT2}$ and thereby enables that transistor. Thus, the combination of p-channel keeper transistors $30_{KT1}$ and $30_{KT2}$ is enabled (or "ON" as shown in FIG. 4), thereby further coupling $V_{DD}$ to precharge node $30_{PN}$ via the series-connected source/drain paths of those two transistors.

The falling transition of CLK at $t_0$ is input to delay circuit $30_{DEL}$, and thereby passes through the three inverters $30_{DINV1}$, $30_{DINV2}$, and $30_{DINV3}$; as a result after a combined delay corresponding to these three signal inversions, at time $t_1$ CLKD rises to a high value. This high value is connected to the gate of p-channel keeper transistor $30_{KT1}$ and thereby disables that transistor. Thus, starting at $t_1$, the combination of p-channel keeper transistors $30_{KT1}$ and $30_{KT2}$ is disabled (or "OFF" as shown in FIG. 4), thereby no longer coupling $V_{DD}$ to precharge node $30_{PN}$ via the series-connected source/drain paths of those two transistors. However, p-channel precharge transistor $30_{PT}$ remains enabled, thereby continuing to couple $V_{DD}$ to precharge node $30_{PN}$ for the duration of the precharge phase.

At a time $t_2$, CLK3 transitions high, thereby disabling p-channel precharge transistor $30_{PT}$ and enabling n-channel discharge transistor $30_{DT}$. With this transition, system 20 is deemed to enter its evaluate phase of operation, with such a label appropriately shown in FIG. 4 following $t_2$. Also during the evaluate phase, the INPUT(S) to logic circuit $30_L$ are valid. Further, recall that the example of FIG. 4 is intended to illustrate the instance wherein the conditional discharge path from precharge node $30_{PN}$ is enabled. Thus, it is assumed that the INPUT(S) to circuit $30_L$ are such that at least one conductive path is formed through logic circuit $30_L$, as illustrated in FIG. 4 by indicating that logic circuit $30_L$ turns "ON" at a time $t_3$, where the difference between $t_2$ and $t_3$ is intended to depict the delay of enabling discharge transistor $30_{DT}$ as well as the relevant transistor(s) in logic circuit $30_L$. Further, as a result of the then-enabled conditional discharge path, the precharge voltage at precharge node $30_{PN}$ is discharged to ground through that path. Thus, following a delay after $t_3$ for this discharge to occur and for the operation of inverter $30_{INV}$, then at a time $t_4$ output $OUT_3$ begins to rise.

Completing the illustration of FIG. 4, recall at $t_2$ CLK3 transitioned high, and this high signal transition is connected as an input to delay circuit $30_{DEL}$. Thus, following the three inversion delay of that circuit as provided by inverters $30_{DINV1}$, $30_{DINV2}$, and $30_{DINV3}$, at a time $t_5$ CLKD transitions low. While this low signal is connected to the gate of p-channel keeper transistor $30_{KT1}$, at that same time however the high from output $OUT_3$ is connected to the gate of n-channel keeper transistor $30_{KT2}$. Thus, continuing after time $t_4$, the combination of n-channel keeper transistors $30_{KT1}$ and $30_{KT2}$ remains off and thereby do not impact the operation of system 20 during its evaluate phase.

Figure 5:
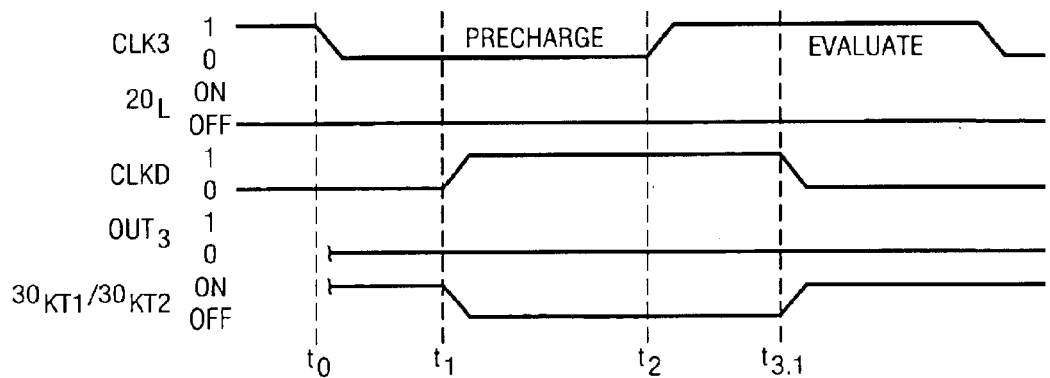
FIG. 5 illustrates a timing diagram of the operation of the preferred embodiment of FIG. 3 where the conditional data path from the precharge node to ground is disabled during the evaluate phase of operation.

FIG. 5 illustrates a timing diagram of various signals in connection with system 30 and for an example where the conditional data path from precharge node $30_{PN}$ to ground is disabled during the evaluate phase of operation. At the outset, the signals in FIG. 5 are the same as shown in FIG. 4 from times $t_0$ through time $t_2$. Thus, the reader is assumed familiar with the previous discussion or is referred thereto for additional details, where such details describe the precharge phase from $t_0$ to $t_2$ and the commencement of the evaluate phase at $t_2$. Following $t_2$ in FIG. 5, again the INPUT(S) to logic circuit $30_L$ are valid, and for the example of FIG. 5 it is assumed that the INPUT(S) to circuit $30_L$ are such that no conductive path is formed through logic circuit $30_L$, as illustrated in FIG. 5 by indicating that logic circuit $30_L$ remains "OFF" as of, and following, $t_2$. At this point, therefore, although discharge transistor $30_{DT}$ is enabled by the high CLK3, there is no enabled current path from precharge node $30_{PN}$ to ground. However, the disabled transistors in logic circuit $30_L$ will leak, and indeed because these transistors are preferably LVT transistors, their leakage will exceed that of their HVT counterparts. Thus, immediately following $t_2$, such leakage may tend to pull down the voltage at precharge node $30_{PN}$, although as described below this leakage is thereafter alleviated as of a time $t_{3.1}$.

At time $t_{3.1}$ (indicated as such to distinguish it from the reference $t_3$ in FIG. 4), CLKD transitions low. Specifically, recall that at $t_2$ CLK3 transitioned high. Thus, following the three-inverter delay of delay circuit $30_{DEL}$, at $t_{3.1}$ is shown the responsive low transition of CLKD. Further, also as of $t_{3.1}$, $OUT_3$ was already low because the conditional discharge path to precharge node $30_{PN}$ was not enabled. As a result, as of $t_{3.1}$, a low signal is connected by CLKD to the gate of p-channel keeper transistor $30_{KT1}$ and a low signal is connected by output $OUT_3$ to the gate of p-channel keeper transistor $30_{KT2}$. Thus, as shown in the last signal of FIG. 5, as of $t_{3.1}$ the combination of p-channel keeper transistors $30_{KT1}$ and $30_{KT2}$ is enabled (i.e., turned on). The enabled combination of p-channel keeper transistors $30_{KT1}$ and $30_{KT2}$ provides a conductive path, along the series-connected source/drains of those two transistors, between $V_{DD}$ and precharge node $30_{PN}$. Additionally, because p-channel keepers transistor $30_{KT1}$ and $30_{KT2}$ are both preferably LVT devices, then as of $t_{3.1}$ an LVT source, formed by these two transistors, provides current to precharge node $30_{PN}$ to offset any leakage that may be occurring in the conditional discharge path due to the LVT transistor(s) in logic circuit $30_L$ of that path. Moreover, note that this offset continues for the remainder of the evaluate phase of system 30.

From the preceding, one skilled in the art should appreciate that system 30 provides various benefits over the prior art. First, in the instance where a single rail dynamic logic circuit does not change state (e.g., provides a low output) due to its conditional discharge path(s) remaining disabled during its evaluate phase, then LVT transistor leakage that might otherwise occur in the discharge path is offset in part or in whole due to the inclusion of LVT transistor current sourcing to the circuit precharge node. Second, in the instance where the single rail dynamic logic circuit does change state (e.g., provides a high output) due to its conditional discharge path(s) being enabled during its evaluate phase, then the LVT transistor current source is disabled and, thus, does not disturb the ability of the circuit to properly discharge during the evaluate phase. Given these benefits, the conditional discharge path may employ LVT n-channel devices to benefit from the speed of those devices when enabled during the evaluate phase, yet any additional leakage provided by those devices when not enabled during the evaluate phase can be offset by the additional current source. In the preferred embodiments, the additional current source implements LVT p-channel devices, and the above functionality is provided by using a delay circuit triggered by the circuit CLK signal, where preferably that delay is three inversions following the CLK signal. However, in an alternative embodiment, other delay configurations may be devised. For example, five inverters could be used. In still another alternative embodiment, yet another structure may be implemented, where a net benefit is realized so long as the LVT p-channel transistor current source is enabled prior to the end of the evaluate phase, but also not too early in the evaluate phase so as to interfere with proper data switching of the circuit in the instances where a conditional discharge path is enabled. Given these timing goals, the LVT p-channel transistor source can be enabled, thereby guarding against leakage and noise. Moreover, this functionality is provided without any additional clocks. Lastly, note that while the present embodiments have been described in detail, various substitutions, modifications or alterations could be made to the descriptions set forth above without departing from the inventive scope which is defined by the following claims.

What is claimed is:

1. A dynamic logic circuit, comprising:
   a precharge node to be precharged to a precharge voltage during a precharge phase;
   a conditional discharge path connected to the precharge node and operable, during an evaluate phase, to conditionally couple the precharge node to a voltage different than the precharge voltage;
   an output for providing a signal in response to a state at the precharge node; and
   voltage maintaining circuitry, coupled to the output, for coupling the precharge voltage to the precharge node during a portion of an instance of the evaluate phase when the conditional discharge path is not enabled during the instance of the evaluate phase.

2. The dynamic logic circuit of claim 1 wherein the voltage maintaining circuitry comprises a low threshold voltage transistor having a conductivity type and a first threshold voltage, wherein the first threshold voltage is lower than a threshold voltage of another transistor in the dynamic logic circuit having a same conductivity type.

3. The dynamic logic circuit of claim 1 wherein the voltage maintaining circuitry comprises a low threshold voltage p-channel transistor having a first threshold voltage, wherein the first threshold voltage is lower than a threshold voltage of another p-channel transistor in the dynamic logic circuit.

4. The dynamic logic circuit of claim 3 and further comprising an inverter having an input connected to the precharge node and an inverter output connected to the output, the inverter comprising a high threshold voltage p-channel transistor having a second threshold voltage greater than the first threshold voltage.

5. The dynamic logic circuit of claim 1 wherein the conditional discharge path comprises at least one n-channel transistor.

6. The dynamic logic circuit of claim 5 wherein the n-channel transistor has a threshold voltage that is lower than a threshold voltage of another n-channel transistor in the dynamic logic circuit.

7. The dynamic logic circuit of claim 5:
   wherein the conditional discharge path comprises a plurality of n-channel transistors; and
   wherein one n-channel transistor in the plurality of n-channel transistors has a threshold voltage that is higher than a threshold voltage of another n-channel transistor in the plurality of n-channel transistors.

8. The dynamic logic circuit of claim 5:
   wherein the conditional discharge path comprises a plurality of n-channel transistors; and
   wherein one n-channel transistor in the plurality of n-channel transistors has a threshold voltage that is higher than a threshold voltage of all other n-channel transistors in the plurality of n-channel transistors.

9. The dynamic logic circuit of claim 1 and further comprising:
   an input for receiving a first clock signal; and
   a precharge transistor, coupled to receive the first clock signal at a gate, and having a source/drain path coupled to receive the precharge voltage and to provide the precharge voltage to the precharge node; and
   wherein the voltage maintaining circuitry couples the precharge voltage to the precharge node during the portion of an instance of the evaluate phase further in response to a second clock signal; and
   wherein the second clock signal represents a delay of the first clock signal.

10. The dynamic logic circuit of claim 9 wherein the second clock signal represents an odd number of inverter delays of the first clock signal.

11. The dynamic logic circuit of claim 9 wherein the second clock signal represents three inverter delays of the first clock signal.

12. The dynamic logic circuit of claim 9 wherein the second clock signal represents five inverter delays of the first clock signal.

13. The dynamic logic circuit of claim 1 wherein the voltage maintaining circuitry further comprises circuitry for precluding a connection of the precharge voltage to the precharge node during at least a beginning portion of the instance of the evaluate phase when the conditional discharge path is not enabled during the instance of the evaluate phase.

14. The dynamic logic circuit of claim 13 wherein the circuitry for precluding comprises a transistor having a gate connected to receive a clock signal.

15. The dynamic logic circuit of claim 14 wherein the transistor has a conductivity type and a first threshold voltage, wherein the first threshold voltage is lower than a threshold voltage of another transistor in the dynamic logic circuit having a same conductivity type.

16. The dynamic logic circuit of claim 13 wherein the circuitry for precluding comprises a p-channel transistor having a gate connected to receive a clock signal.

17. The dynamic logic circuit of claim 16 wherein the p-channel transistor has a first threshold voltage, wherein the first threshold voltage is lower than a threshold voltage of another p-channel transistor in the dynamic logic.

18. The dynamic logic circuit of claim 1 wherein the voltage maintaining circuitry further comprises circuitry for precluding a connection of the precharge voltage to the precharge node during an entirety of the evaluate phase when the conditional discharge path is enabled during the evaluate phase.

19. The dynamic logic circuit of claim 18 wherein the circuitry for precluding comprises a transistor having a gate connected to the output.

20. The dynamic logic circuit of claim 19 wherein the transistor has a conductivity type and a first threshold voltage, wherein the first threshold voltage is lower than a threshold voltage of another transistor in the dynamic logic circuit having a same conductivity type.

21. The dynamic logic circuit of claim 18 wherein the circuitry for precluding comprises a p-channel transistor having a gate connected to the output.

22. The dynamic logic circuit of claim 21 wherein the p-channel transistor has a first threshold voltage, wherein the first threshold voltage is lower than a threshold voltage of another p-channel transistor in the dynamic logic circuit.

23. The dynamic logic circuit of claim 1 wherein the voltage maintaining circuitry comprises two low threshold voltage transistors, each having a same conductivity type and a first threshold voltage, wherein the first threshold voltage is lower than a threshold voltage of another transistor in the dynamic logic circuit having a same conductivity type.

24. The dynamic logic circuit of claim 1 wherein the circuitry for maintaining comprises:
   a first transistor having a gate connected to the output, a first source/drain connected to the precharge node, and a second source/drain connected to a node; and
   a second transistor having a first source/drain connected to the node and a second source/drain connected to receive the precharge voltage.

25. The dynamic logic circuit of claim 24 and further comprising:
   an input for receiving a first clock signal; and
   a precharge transistor, coupled to receive the first clock signal at a gate, and having a source/drain path coupled to receive the precharge voltage and to provide the precharge voltage to the precharge node; and
   wherein the second transistor has a gate connected to receive a second clock signal; and
   wherein the second clock signal represents a delay of the first clock signal.

26. The dynamic logic circuit of claim 25 wherein the second clock signal represents an odd number of inverter delays of the first clock signal.

27. The dynamic logic circuit of claim 1 wherein the voltage maintaining circuitry comprises:
   a first transistor having a gate connected to the output and a source/drain path; and
   a second transistor having a gate connected to receive a clock signal that represents an odd number of inverter delays of a clock signal that starts the evaluate phase; and
   wherein the source/drain of the first transistor and the source/drain path of the second transistor are connected in series between the precharge voltage and the precharge node.

28. A method of operating a dynamic logic circuit, comprising:
   precharging a precharge node to a precharge voltage during a precharge phase;
   conditionally discharging a conditional discharge path connected to the precharge node during an evaluate phase, wherein discharging the conditional discharge path couples the precharge node to a voltage different than the precharge voltage;
   providing at an output a signal in response to a state at the precharge node; and
   coupling the precharge voltage to the precharge node during a portion of an instance of the evaluate phase when the conditional discharge path is not enabled during the instance of the evaluate phase.

29. The method of claim 28 wherein the coupling step comprises coupling with at least one low threshold voltage transistor having a conductivity type and a first threshold voltage, wherein the first threshold voltage is lower than a threshold voltage of another transistor in the dynamic logic circuit having a same conductivity type.

30. The method of claim 28 wherein the coupling step comprises coupling with at least one low threshold voltage p-channel transistor having a conductivity type and a first threshold voltage, wherein the first threshold voltage is lower than a threshold voltage of another p-channel transistor in the dynamic logic circuit having a same conductivity type.

31. The method of claim 28 wherein the step of conditionally discharging a conditional discharge path comprises enabling at least one n-channel transistor.

32. The method of claim 31 wherein the n-channel transistor has a threshold voltage that is lower than a threshold voltage of another n-channel transistor in the dynamic logic circuit.

33. The method of claim 28:
   wherein the precharging step is in response to a first clock signal; and
   wherein the coupling step is in response to a second clock signal.

34. The method of claim 33 wherein the second clock signal represents an odd number of inverter delays of the first clock signal.

35. The method of claim 33 wherein the second clock signal represents three inverter delays of the first clock signal.

36. The method of claim 33 wherein the second clock signal represents five inverter delays of the first clock signal.

37. The method of claim 28 and further comprising precluding a connection of the precharge voltage to the precharge node during at least a beginning portion of the instance of the evaluate phase when the conditional discharge path is not enabled during the instance of the evaluate phase.

38. The method of claim 28 and further comprising precluding a connection of the precharge voltage to the precharge node during an entirety of the evaluate phase when the conditional discharge path is enabled during the evaluate phase.

39. The method of claim 28 wherein the coupling step comprises:
   operating a first transistor having a gate connected to the output and a source/drain path; and
   operating a second transistor having a gate connected to receive a clock signal that represents an odd number of inverter delays of a clock signal that starts the evaluate phase; and
   wherein the source/drain of the first transistor and the source/drain path of the second transistor are connected in series between the precharge voltage and the precharge node.

* * * * *